United States Patent [19]
Strickland et al.

[11] Patent Number: 6,097,249
[45] Date of Patent: Aug. 1, 2000

[54] METHOD AND DEVICE FOR IMPROVED CLASS BD AMPLIFICATION HAVING SINGLE-TERMINAL ALTERNATING-RAIL DUAL-SAMPLING TOPOLOGY

[75] Inventors: James C. Strickland, Mesa; Carlos A. Castrejon, Phoenix, both of Ariz.

[73] Assignee: Rockford Corporation, Tempe, Ariz.

[21] Appl. No.: 09/145,641

[22] Filed: Sep. 2, 1998

[51] Int. Cl.$^7$ .................................................. H03F 3/38
[52] U.S. Cl. .......................................... 330/10; 330/251
[58] Field of Search .......................... 330/10, 51, 207 A, 330/251, 297

[56] References Cited

U.S. PATENT DOCUMENTS

| | | | |
|---|---|---|---|
| 3,629,616 | 12/1971 | Walker | 307/254 |
| 3,808,545 | 4/1974 | Stanley | 330/146 |
| 4,020,361 | 4/1977 | Suelzle et al. | 307/106 |
| 4,162,455 | 7/1979 | Birt | 330/10 |
| 4,229,706 | 10/1980 | Bongiorno | 330/297 X |
| 4,467,288 | 8/1984 | Strickland | 330/149 |
| 4,600,891 | 7/1986 | Taylor et al. | 330/10 |
| 4,980,649 | 12/1990 | Gulczynski | 330/10 |
| 5,014,016 | 5/1991 | Anderson | 330/10 |
| 5,617,058 | 4/1997 | Adrian et al. | 330/10 |
| 5,657,219 | 8/1997 | Stanley | 363/132 |
| 5,898,340 | 4/1999 | Chatterjee et al. | 330/251 |

OTHER PUBLICATIONS

Reinventing the Power Amplifier—BCA (The Balanced Current Amplifier—a new paradigm for the $21^{21}$ Century), http://www.crownaudio.com/REINVENT.htm, Crown International, Inc. May 6, 1997.

McLaughlin et al., "Audio Amplifier Efficiency and Balanced Current Design—A New Paradigm", Audio Engineering Society Preprint, $103^{rd}$ Convention, 1977 Sep. 26–29, New York.

Nielsen, "High Fidelity PWM based Amplifier Concept for Active Speaker Systems with a very Low Energy Consumption", Audio Engineering Society Preprint, $100^{100}$ Convention, 1966 May 11–14 Copenhagen.

Vanderkooy, "New Concepts in Pulse–Width Modulation", Audio Engineering Society Preprint, $97^{th}$ Convention, 1994 Nov. 10–13, San Francisco.

Anderskouv et al., "High Fidelity Pulse Width Modulation Amplifiers based on Novel Double Loop Feedback Techniques", Audio Engineering Society Prepint, $100^{th}$ Convention 1996 May 11–14 Copenhagen.

*Primary Examiner*—Steven J. Mottola
*Attorney, Agent, or Firm*—Steptoe & Johnson LLP

[57] ABSTRACT

An improved Class BD amplifier provides an amplified output signal by pulse width modulation techniques by sampling a carrier wave, usually a triangular or saw tooth waveform, according to an input signal to be amplified, as in a conventional class D amplifier. The resulting sampling waveform controls the connectivity of the potential supplies 34, 36 to the power rails 14, 18 via the first switch 12 so that a first potential and a second potential are alternately supplied to the first power rail 14 and so that a third potential and fourth potential are alternately supplied to the second power rail 18. As shown in FIG. 8, the first potential is positive, the second and third potentials are at ground, and the fourth potential is negative. In addition, a constant potential difference is maintained between the first and second power rails 14, 18. The power rails are alternately connected to a Class AD output stage 26 by another switch 30, the connectivity of which is controlled by a second sampling waveform, $PWM_2$. This second sampling waveform $PWM_2$ may also be derived by sampling a triangular or saw tooth carrier wave by the input signal.

27 Claims, 8 Drawing Sheets

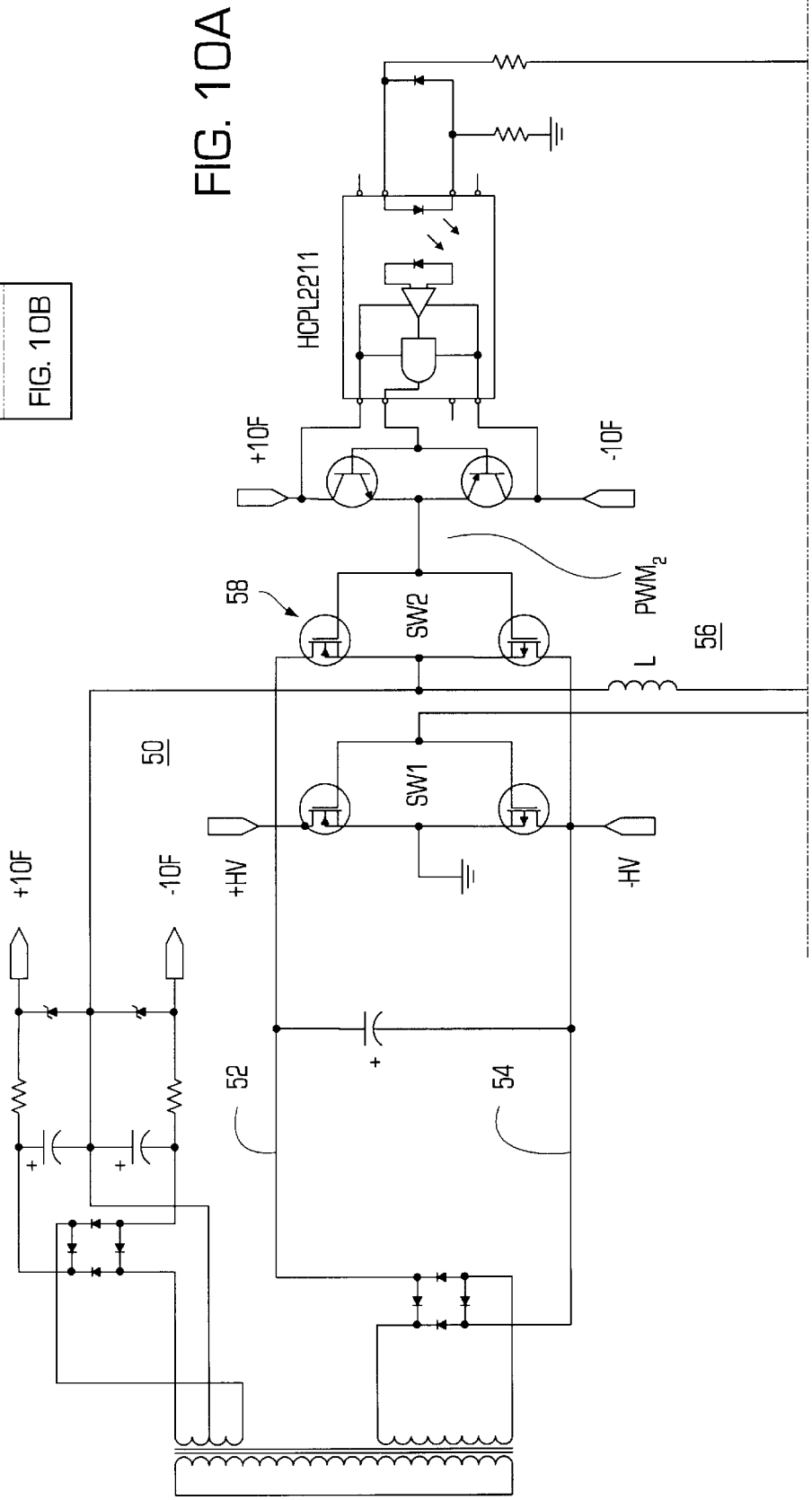

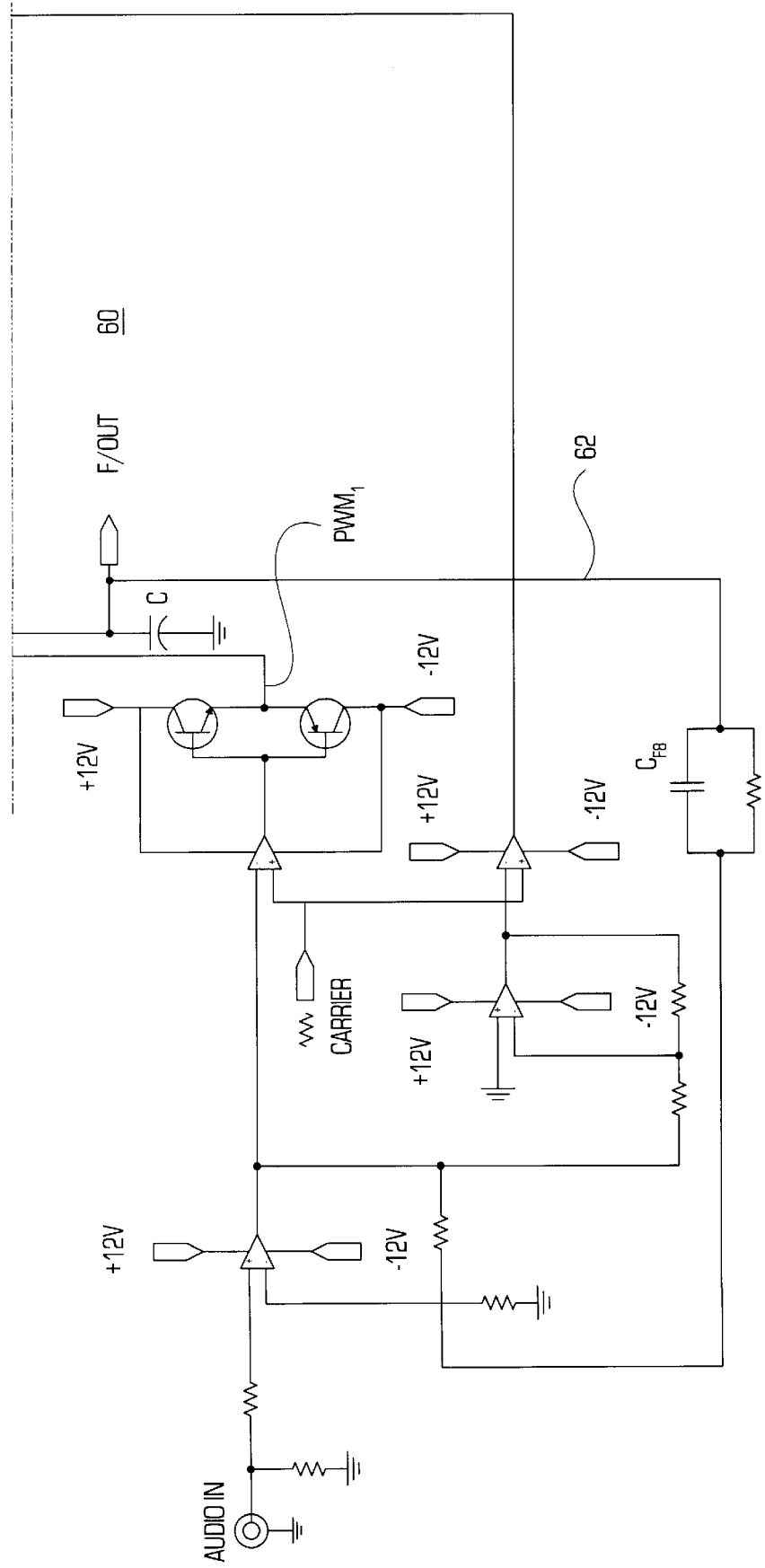

METHOD AND DEVICE FOR IMPROVED CLASS BD AMPLIFICATION HAVING SINGLE-TERMINAL ALTERNATING-RAIL DUAL-SAMPLING TOPOLOGY

FIELD OF THE INVENTION

The present invention relates to the field of electronics, and in particular to an improved method and apparatus for generating an amplified Class BD output signal.

BACKGROUND OF THE INVENTION

Class D amplifiers, also called pulse-width-modulation (PWM) amplifiers, have been known in the art for more than half a century. In a typical Class D amplifier, the output signal switches on and off at a variable rate according to an input signal. Typical Class D amplifiers employ only switching processes in their output system and can theoretically be highly efficient. However, use of Class D amplifiers for high fidelity audio is relatively rare.

Class D amplifier output circuits typically employ either a half-bridge circuit, as shown in FIG. 1, or a full bridge (H-bridge) circuit, as shown in FIG. 2 to recover a continuous signal. The use of an H-bridge allows operation with a single-polarity power supply to generate two mirror-image output signals, which are bridged to supply the output. Both half-bridge and full-bridge amplifiers produce the classical two-state operation (+/−V) of Class D amplifiers. These bridged amplifiers are sometimes now referred to as Class AD amplifiers.

There are numerous disadvantages to Class AD operation. The most serious problems result from the two-state operation format, which can distort the output signal during demodulation. A high level of output ripple voltage exists at low signal levels. It is thus difficult to design LC low-pass filters of suitable carrier rejection without the AC impedance of the low-pass filter causing serious attendant power limitations at upper audio frequencies. This two-state operation also yields low efficiency at low signal levels because of strong circulating currents in the resonant LC circuit of the amplifier. These circulating currents cause heating in the resistance of the inductor and other amplifier components. High output ripple voltages also limit the effectiveness of negative feedback.

Three-state operation Class BD systems were devised to overcome some of these deficiencies of Class D and Class AD operation. As disclosed by U.S. Pat. No. 3,629,616 to Walker, titled High Efficiency Modulation Circuit for Switchmode Audio Amplifier, a Class BD amplifier generates sets of variable-width pulse trains of either positive or negative polarity at an instant signal condition. The generated signal returns to zero volts between pulses. The three-state operation is known as Class BD operation because pulses of only one polarity actually "carry" the signal at a given signal polarity, and the output is similar to the operation of a traditional Class B power amplifier.

In a typical Class BD system, as shown in FIG. 3, two appropriate Pulse Width Modulated (PWM) switching waveforms are formed by dual sampling a triangular carrier waveform.

An example of sampling a triangular waveform by an audio input signal $V_{in}$, as shown in FIG. 4. In-phase carrier waves and opposite-phase audio waves are often used to generate the PWM switching waveforms. The two PWM switching waveforms are then amplified to appear at two conventional output points 110, 112 of an H-bridge, as shown in FIG. 3. Each output waveform passes through a respective filter inductor 114, 116 and into a single common filtering capacitor 118. A load 120 parallels the filtering capacitor. The output of this system floats and is the difference between the dual-sampling PWM waveforms. This dual sampling process results in final PWM output switching pulses at twice the carrier frequency (2F) and having a, single polarity which follows the polarity of the instant input signal.

Class BD systems have significant advantages at low output levels, where the final output pulse widths approach zero, unlike Class AD systems, which approach 50%. At these low output levels, the output ripple voltages and circulating current losses in the LC circuitry also approach zero, which allows for very high efficiency at all signal levels. Furthermore, such Class BD systems have advantages over Class AD systems. For example, the second order LC filter of the Class BD system attenuates the twice-frequency ripple in the transformed wave by 12 dB more than in a conventional Class AD system. In addition, the output pulses have half the amplitude of a comparable two-state, Class AD system because they are only one polarity at a time. This half amplitude provides an additional 6 dB attenuation. Thus, Class BD systems yield a total advantage of 18 dB over a comparable Class AD system.

Audio power amplifiers of any class which must output their signal on two non-grounded terminals are generally considered less than fully desirable and prohibit applications requiring that one output terminal be at ground potential. The situation is far more troublesome in PWM amplifiers. An excellent analysis of differential-output Class BD systems was presented by J. Vanderkooy, in Preprint 3886 for the $97^{th}$ Convention of the Audio Engineering Society, November 1994, entitled "New Concepts in Pulse-Width Modulation." In that analysis, Vanderkooy cautions that H-bridge operation of Class BD designs results in a virtually unsolvable design conflict in the low-pass LC demodulation filter. Although the arrangement shown in FIG. 3 results in full carrier cancellation when viewed differentially across the H-bridge output terminals, the configuration leaves full-level, common-mode Class AD output signals present on both terminals with respect to ground, which presents a serious and difficult EMI problem.

Filters using capacitors to ground are successful for conventional Class AD amplifiers. Such filtering changes the Class BD operation back into two, independent Class AD outputs, introduces the associated disadvantages of circulating current losses, and virtually negates the dominant motivation of adopting Class BD circuits over Class AD circuits.

Vanderkooy also notes also that his first evaluation of Class BD systems for the cited 1994 AES Journal paper employed a system which forms the parallel sum of the two output legs of an H-bridge, each carrying a Class AD signal. In the Vanderkooy system the output carriers are out of phase, and the audio modulation in phase, as shown in FIG. 5. The carrier signals cancel as they are summed through inductors in each output leg, whereas the demodulated audio signals add. A similar connection is shown by Stanley in U.S. Pat. No. 5,657,219 and by Gulczynski in U.S. Pat. No. 4,980,649. This summation approach avoids the EMI problem inherent to the device shown in FIG. 3, but leaves the efficiency losses in the output inductors, because each LC filter sees the same carrier signals as in Class AD (i.e., 50% duty cycle pulses at zero input signal).

In U.S. Pat. No. 4,020,361, Suelzle discloses a Switching Mode Power Controller of Large Dynamic Range. Suelzle discloses a differential method for forming very short pulses which avoids the need for opening and closing a single switch in rapid sequence to produce a Class BD pulse train. In U.S. Pat. No. 4,162,455, entitled Amplifier Systems, Birt discloses a method for canceling the switching frequency in the output by modulating two separate Class D amplifiers by symmetrically interlaced clock pulse trains. A description of another Class BD modulation technique which is considered "high efficiency" is in U.S. Pat. No. 5,014,016 for a Switching Amplifier to Anderson.

All of the Class BD amplifiers discussed above can throughput weak signals, as they depend on Suelzle's teaching described above. However, none of the Class BD patents discussed above teach how such subtractive systems are able to function on very weak signals, such as one 1,000 times weaker than a signal having a pulse-width equal to system rise-time.

To reproduce 100 dB of dynamic range, a PWM system must reproduce a demodulated signal equating to pulses of 1/100,000 of the system's typical longest pulses. Thus, pulses of 20–50 picoseconds appear to be required, which are signal pulses of one-thousandth of the typical rise-time of the switches (e.g. 30 nanoseconds). Such short pulses are clearly not feasible and are fortunately not required.

A Class BD system changes operation dramatically for signal pulses narrower than rise-time, as shown in FIG. 6. In Class BD systems, two PWM signal edges 122 and 124 are subtracted to represent a signal of width $t_P$, less than system rise time $t_R$. Analysis by similar triangles shows that a new, equivalent pulse of width $t_R$ is formed with reduced amplitude $a=A(t_P/t_R)$. The pulse "value" is thus accurately preserved because the process creates a substitute pulse of area equivalent to the irreproducible pulse by increasing width proportionally to the reduction of amplitude. Thus, in a system having 50 nanosecond rise time, a signal level which equates to a 50 picosecond pulse-width will have an amplitude of only 1/1000 of the normal pulse amplitude, but will be spread out 1000 times wider. Thus, pulse amplitude modulation (PAM) may be used when Pulse Width Modulation (PWM) becomes unfeasible.

Because the filtering process following the subtraction step in subtractive Class BD amplifiers employs only passive, linear components, the passive filter will convert a given pulse area of any height to the appropriate instant output signal. The passive filter is blind to the pulse reshaping activity described above. Thus, subtractive Class BD systems maintain dynamic range for pulse durations vastly less than system rise time and eliminate the need for elaborate and costly digital algorithms to correct pulse-width distortion caused in three-switch systems by switch rise-times (as shown, for example, in U.S. Pat. No. 5,617,058 to Adrian et al.).

In addition, all of the Class D systems discussed above effectively keep the load always switched to a low-impedance source of potential, including ground, thus generating an inherently low output impedance before the LC filter. However, the required LC filter contributes considerable impedance and frequency-response aberrations in the upper range of audio frequencies. This problem has been particularly troublesome in Class AD designs in which the high level of ripple has effectively precluded use of sufficient negative feedback to counteract the filter aberrations.

SUMMARY OF THE INVENTION

It is an object of the present invention to generate a single-terminal, three-state, Class BD output signal directly and completely within the amplifier's switching devices, inherently suppressing an input carrier and all odd harmonics of the input carrier wave, as in the differential-output, dual-sampling systems in known Class BD amplifier systems. The highly-desirable, single-terminal output format is achieved by proper dynamic modulation of the normally fixed +/– power rails, which supply a conventional half-bridge Class AD stage, to suppress the input carrier before it is formed.

BRIEF DESCRIPTION OF THE DRAWINGS

FIG. 10 is a circuit schematic of another embodiment of an improved Class BD amplifier system of the present invention having a floating power supply.

DETAILED DESCRIPTION OF THE PREFERRED EMBODIMENT

Figure 1:
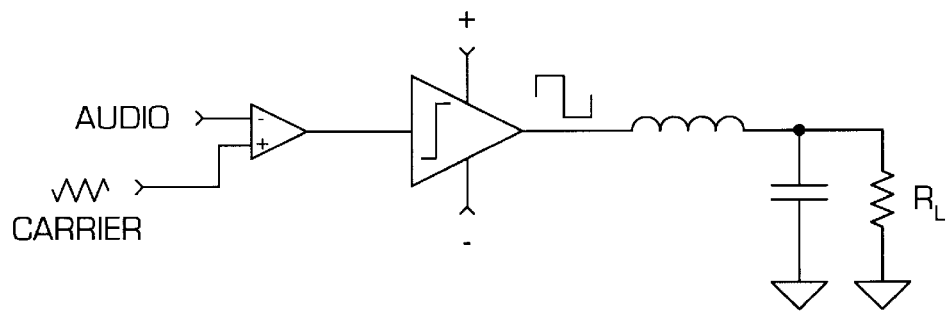
FIG. 1 is a diagram of a known Class AD power amplifier employing a half-bridge circuit.
Figure 2:
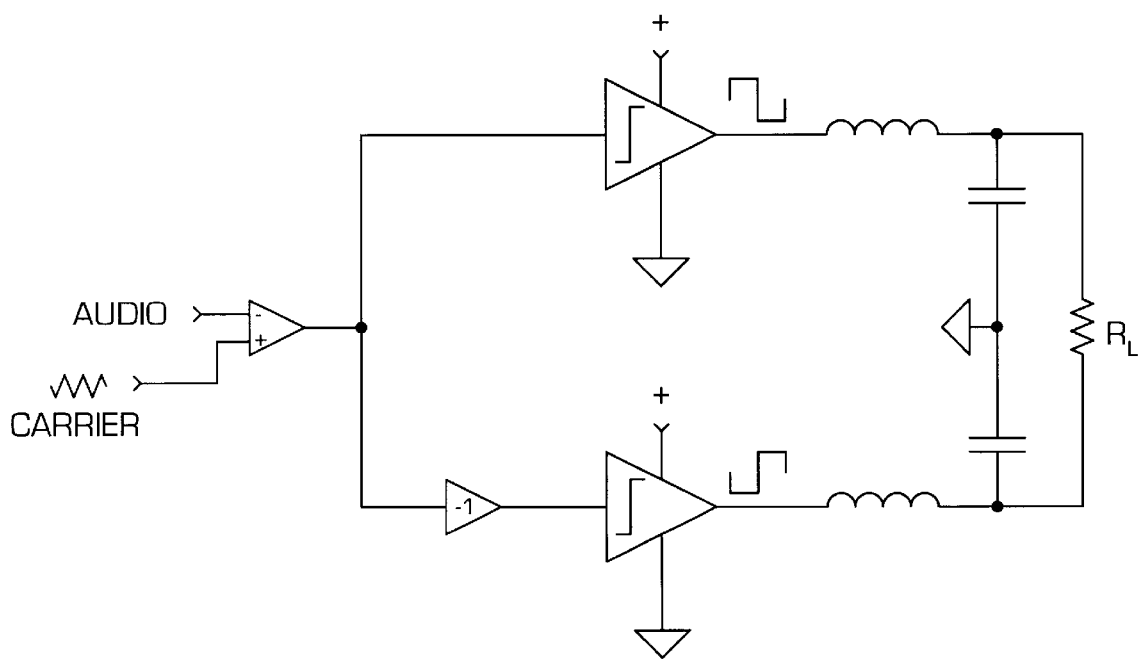
FIG. 2 is a diagram of a known Class AD power amplifier employing a full-bridge circuit.
Figure 3:
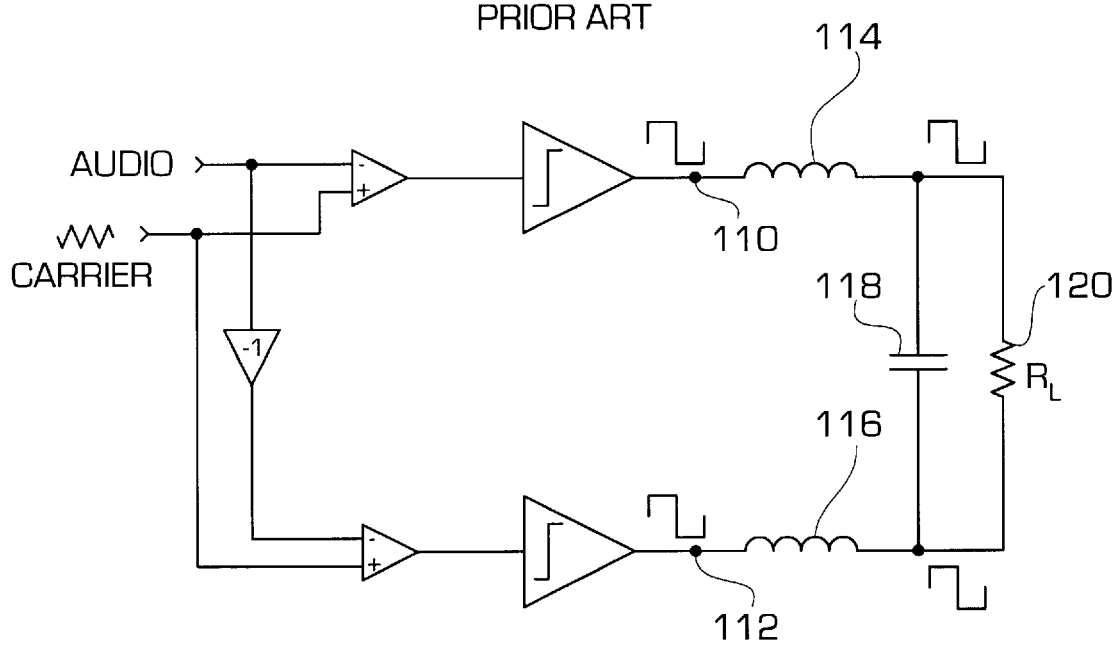
FIG. 3 is a diagram of a known differential H-bridge Class BD power amplifier.
Figure 5:
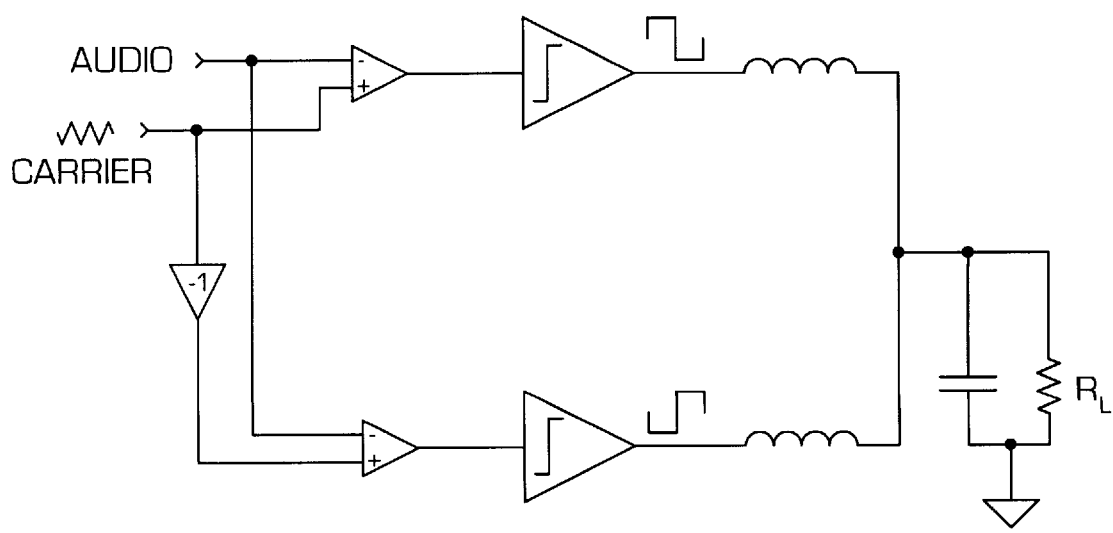
FIG. 5 is a diagram of a known summing H-bridge Class BD power amplifier.
Figure 4:
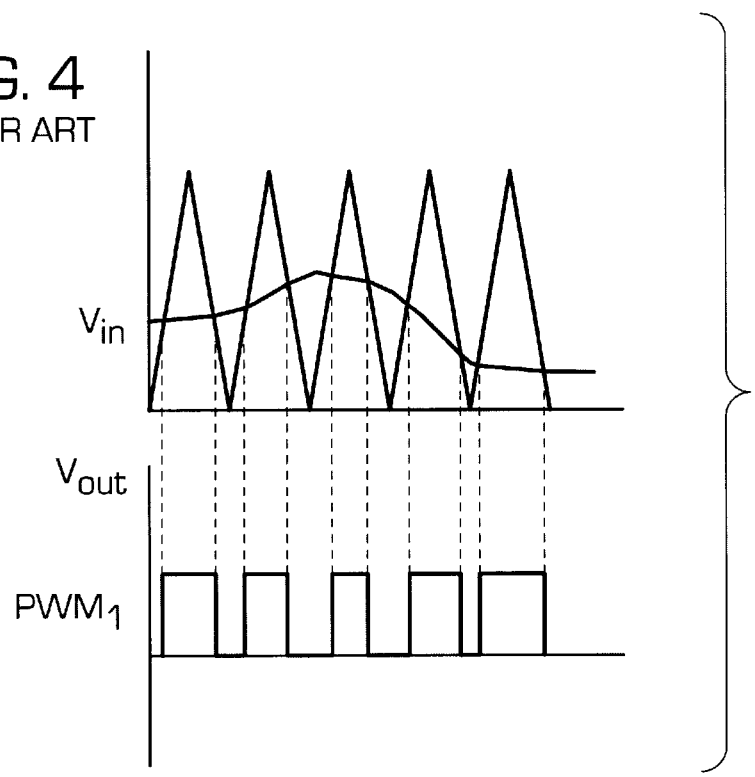
FIG. 4 is an example of typical sampling of a triangular waveform by an input audio signal to develop a pulse wave modulated waveform.
Figure 6:
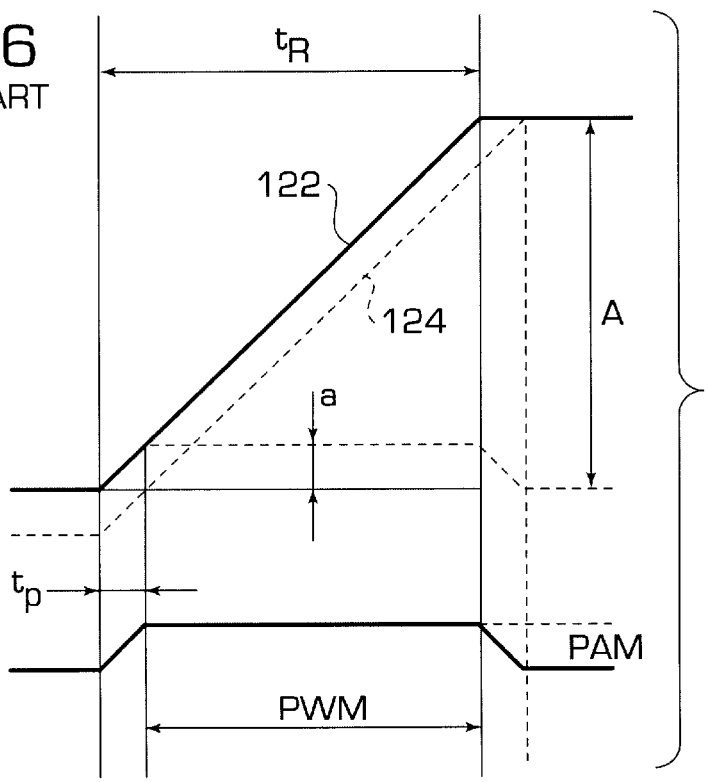
FIG. 6 is a diagram depicting the waveform of the operation of a typical Class BD amplifier at very low signal levels.
Figure 7:
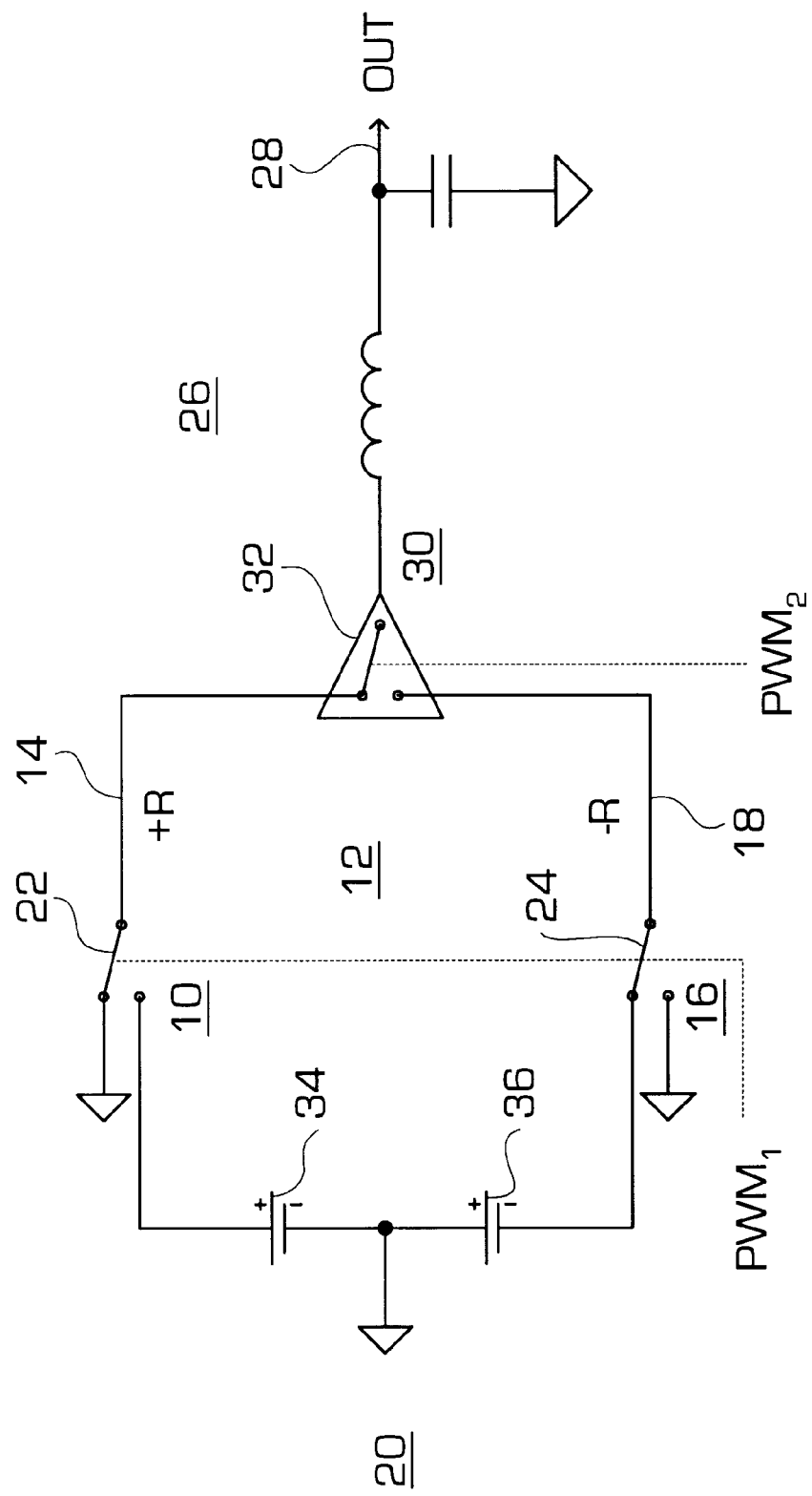
FIG. 7 is a diagram depicting one embodiment of an improved Class BD amplifier system having fixed power supplies.
Figure 8:
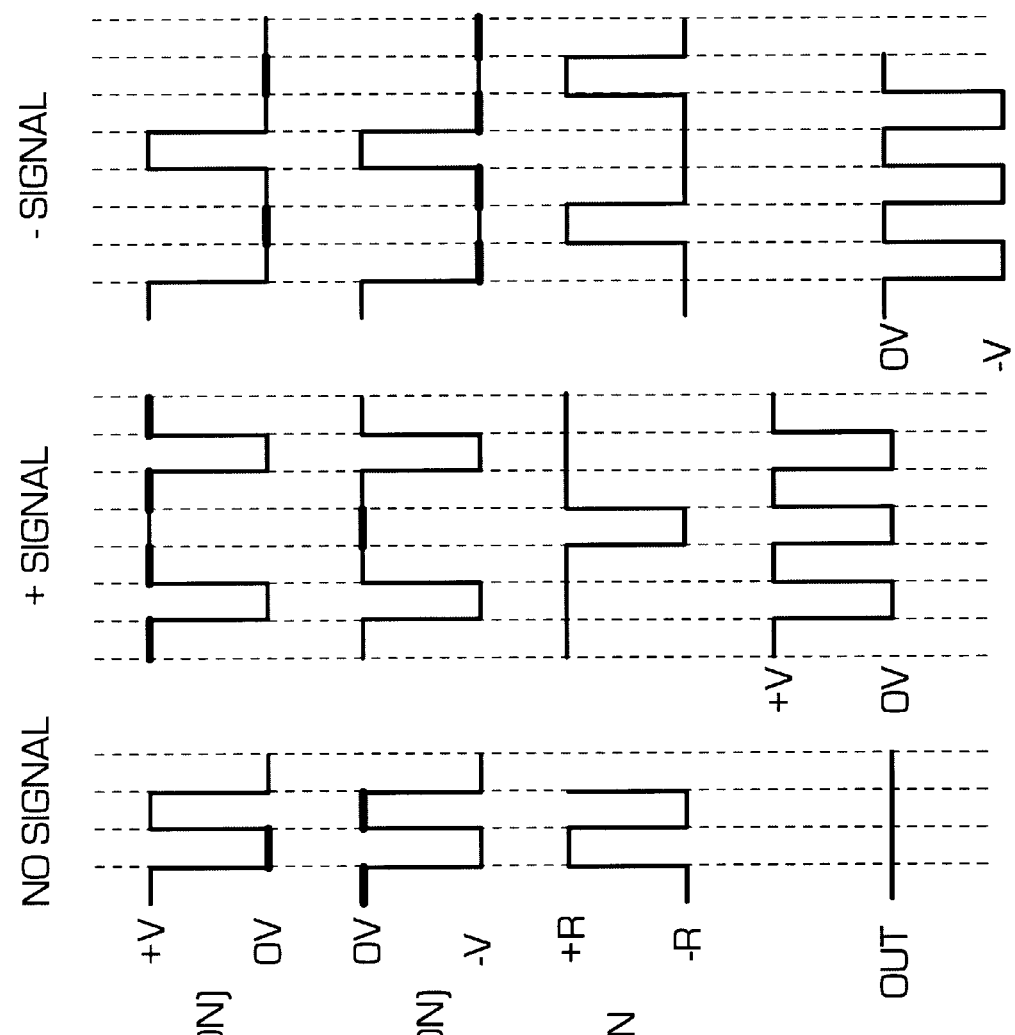
FIG. 8 is a timing chart for an improved Class BD amplifier system.

FIG. 7 is a circuit diagram of a first embodiment of the present invention. A first pole 10 of a double pole, double throw (DPDT) switch 12 activates power rail +R 14, while a second pole 16 of the DPDT switch 12 deactivates a second power rail –R 18 by connecting the power rails 14, 18 alternately to a fixed power supply 20. The wipers 22, 24 of the DPDT switch are driven by one of dual-sampling input waves $PMW_1$ and $PMW_2$, as shown in FIG. 8 and discussed below. This switching by the DPDT switch 12 results in a constant potential difference between the two power rails 14, 18. Each of the power rails 14, 18 is, in turn, connected to an AD output stage 26 having a single output terminal 28 by a single pole, double throw (SPDT) switch 30. The wiper 32 of the SPDT switch 30 operates in accordance with another dual-sampling wave $PWM_2$. In the fixed-supply configuration of FIG. 7, simultaneous switching of the two poles 10, 16 of the DPDT switch 12 result in a synchronized alternation of rail voltages precisely following the $PWM_1$ signal. The circuit thus provides the conventional fixed positive and negative potential supplies typical of half-bridge amplifiers of an analog or digital nature. Known switching devices such as P-channel and N-channel MOSFETs and power MOSFETs or other transistor switching devices may be used as the DPDT and the SPDT switches of the present invention. FIG. 8 illustrates waveforms from the circuits of FIGS. 7 and 9.

As shown in FIG. 8, the carrier wave component of the system is nulled by pre-subtracting $PWM_1$ from the Class AD output stage's output waveform by the disclosed rail modulation. The instant state of the first power rail +R 14 and the instant state of the second power rail –R 18 maintain a constant potential difference. The dual-sampling wave $PWM_1$ drives respective portions of the DPDT switch 12 to connect the respective power rails 14, 18 alternately to ground and to a voltage potential. FIG. 8 (a) shows the connectivity of the first power rail 14 to ground and to a first potential. FIG. 8 (b) shows the connectivity of the second power rail 18 to ground and to a second potential, which is of opposite polarity to the first potential. FIG. 8 (c) shows the connectivity of each power rail 14, 18 to the AD output stage 26 via the SPDT switch 30. FIG. 8 (d) shows the output waveform which results from the connectivity according to FIGS. 8 (a)–(c).

As shown in the first column of FIG. 8, when there is no signal input to the embodiment of FIG. 7, both of the dual-sampling waves $PWM_1$, which drives the DPDT switch 12, and $PWM_2$, which drives the SPDT switch 30, operate with a 50% duty cycle.

As shown in the second column of FIG. 8, when a positive signal is input to the embodiment of FIG. 7, the upper pole 10 of the DPDT switch 12 connects the first power rail +R 14 to the positive supply 34 for an extended duty cycle (greater than 50%), and simultaneously the lower pole 16 of the DPDT switch 12 connects the second power rail –R 18 to ground for the same extended duty cycle. At the same time, the SPDT switch 30 connects to the first power rail +R 14 for a duty cycle greater than 50%, which results in positive output pulses having double the carrier frequency. A forced zero-voltage output occurs whenever the SPDT switch 30 connects to a power rail 14, 18 which has been connected to ground via a pole 10, 16 of the DPDT switch 12. This zero-voltage output occurs twice per switching cycle, once through the first power rail +R 14 and once through the second power rail –R 18.

Similarly, as shown in the third column of FIG. 8, for a negative input signal, the lower pole 16 of the DPDT switch 12 connects the second power rail –R 18 to the negative supply 36 for an expanded duty cycle greater than 50% and simultaneously the upper pole 10 of the DPDT switch 12 connects the first power rail +R 14 to ground for the same expanded duty cycle. At the same time, the SPDT switch 30 connects to the second power rail –R 18 for a duty cycle greater than 50%, which results in negative output pulses having double the carrier frequency. A forced zero-voltage output occurs whenever the SPDT switch 30 connects to a power rail 14, 18 which has been connected to ground via a pole 10, 16 of the DPDT switch 12. This zero-voltage output occurs twice per switching cycle, once through the first power rail +R 14 and once through the second power rail –R 18.

The average value of the output signal is proportional to the area under the output pulse, where the polarity of the pulse is the same as the instant input signal.

ALTERNATE EMBODIMENTS

Figure 9:
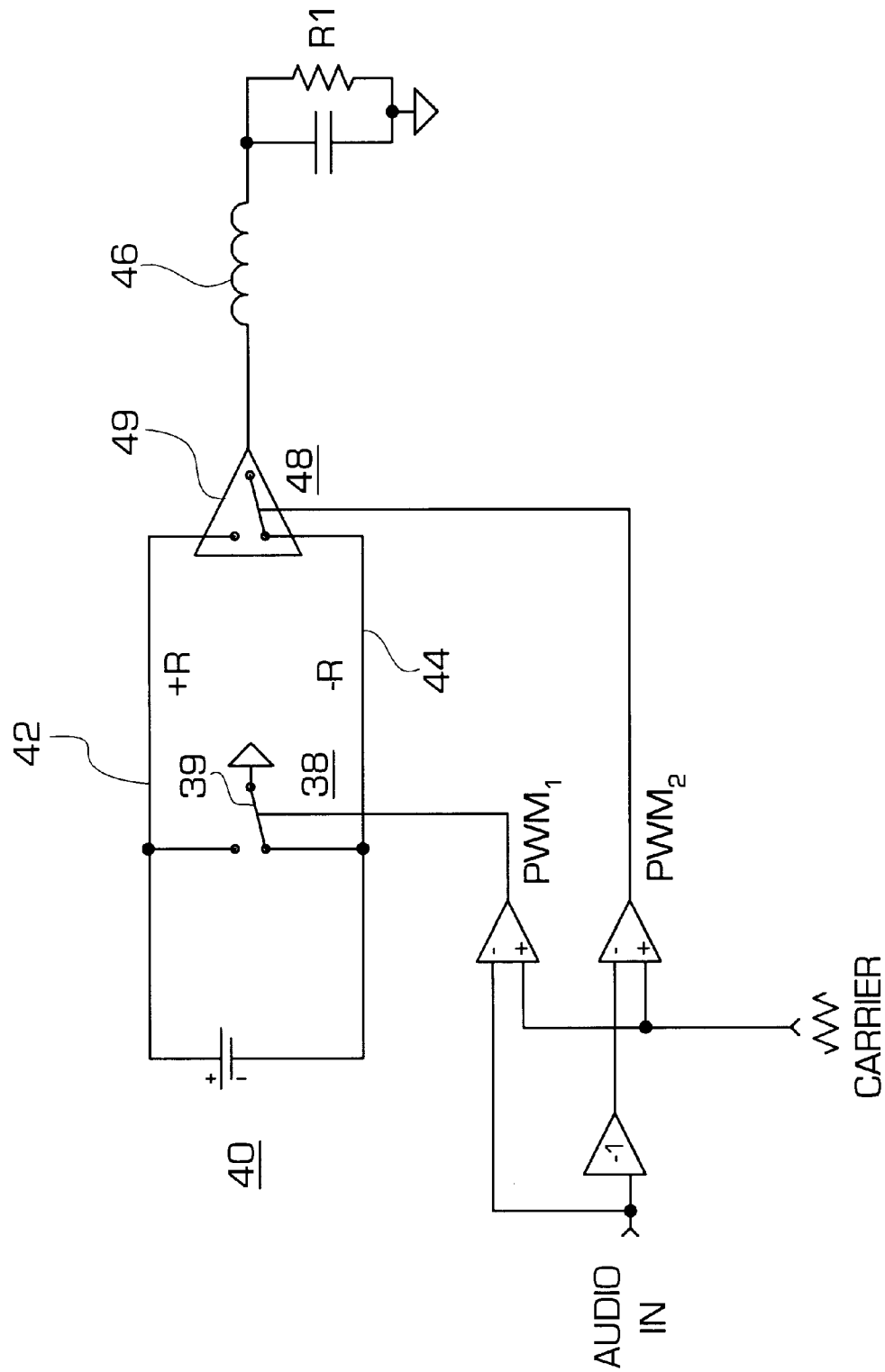
FIG. 9 depicts another embodiment of an improved Class BD amplifier system having a dynamically floating power supply.

In another embodiment employing a floating power supply, as shown in FIG. 9, an SPDT switch 38 and a dynamically floating power supply 40 provide alternating power rail connectivity. This embodiment adopts the principle of a "grounded" bridge and a differential output class BD using H-bridges. In this embodiment, the floating power supply is forced to change potential at typical PWM switching rates.

Floating power supplies have been employed for special advantages in proprietary analog audio power amplifier designs for many years, as exemplified in U.S. Pat. Nos. 3,808,545; 4,229,706; and 4,467,288. In all of these designs, power supplies are floated with respect to ground and forced to change potential at audio-frequency rates. However, a system benefiting from a floating power supply forced to change potential at typical PWM switching rates of several hundred kilohertz has not been previously disclosed.

As shown in FIG. 9, a floating power supply 40 provides a positive potential +R on a first power rail 42 and a negative potential –R on a second power rail 44. A sampling input drive waveform $PWM_1$ activates a switch 38 to alternately connect the power rails to ground, thus placing zero potential on one power rail 42, while the other power rail 44 provides its respective potential to an output stage 46 via switch 48. The connectivity of switch 48 is controlled by a second sampling input drive wave $PWM_2$.

Although a floating supply system has the advantage of requiring one fewer pole in the rail-alternation switch than in the previously described embodiment, a floating supply system has disadvantages. The switch devices which alternate the power rails must charge and discharge all parasitic capacitances, which are inherent in the floating supply system, to ground twice per complete switching cycle. As demonstrated by the calculations below, switching losses caused by parasitic capacitances in the floating supply system may be negligible. For example, assuming a parasitic capacitance of 1000 picofarads, including unavoidable MOSFET capacitances, in which the capacitance is charged and discharged over a 100 volt potential at a 200 kHz switching-cycle rate, the switching loss may be calculated as follows:

$$P = \frac{1}{2} \times C \times V^2 \times 2F_s$$
$$P = 0.5 \times (1 \times 10^{-9}) \times (100)^2 \times 2 \times (200 \times 10^3)$$
$$= 2 \text{ watts}$$

This loss is essentially negligible since an amplifier having these parameters could deliver 2500 watts into a 2 ohm load, for which the parasitic loss would be less than 0.1%.

A more serious disadvantage of the use of a floating power supply is that typically the terminals which suffer these parasitic capacitances are at points in the circuit that cannot be connected directly to the ground point of the rail-alternation switch. Such terminals include, for example, the primary of power transformers in both line and battery powered devices, which cause undesirable EMI to appear on these terminals. To minimize this problem, charging currents must be "re-routed" to the ground point of the rail-alternation switch. In line-powered applications, it is thus essential to include a Faraday shield connected directly to the power line system and the ground point of the rail-alternation switch between all floating windings carrying large switching signals. Failure to do so will result in the serious problem of conducted EMI on the power line system, equipment chassis and circuit grounds.

A more comprehensive schematic of a floating-supply embodiment is shown in FIG. 10. This diagram shows a circuit arrangement which provides proper device drive in the alternated Class AD output stage. A floating power supply 50 provides a positive potential on a first power rail 52 and a negative potential on a second power rail 54. A dual sampling input drive waveform $PWM_1$ activates a switch 51 to alternately connect the power rails 52, 54 to ground, thus driving on one power rail to a zero potential, while the other power rail provides its respective non-zero voltage potential. The connectivity of switch 58 is controlled by a second dual sampling input drive wave PWM$_2$.

This overall system involves no signal-driven charge pumps and will work with signal frequencies down to DC. The system is highly immune to cross-conduction between N- and P- channel devices because of the connected-gate drive systems within each switch pole 39, 49.

The Class BD operation disclosed herein has excellent properties for cooperation with conventional audio negative feedback. An example of negative feedback via a feedback loop 62 is also shown in FIG. 10. The single output terminal 60, combined with low ripple allow the inclusion of significant quantities of lead compensation, unwinding the limit rotation of −180° inherent in the LC filter. The lead capacitor, C$_{FB}$, needs to be much larger than in linear practice, and can be so in the present embodiment because of the natural upper frequency limit of the sampled-data system.

The advantages of the single-terminal, alternating-rail format taught herein can also be achieved in an amplifier having a digital signal input. In this case the PWM comparators are eliminated and the equivalent square-wave gate-drive signals are developed by digital signal processing (DSP) methods. Typically no overall feedback loop is employed, and the DSP architecture corrects distortion on a predictive basis. However, without overall negative feedback it becomes difficult to design an output low-pass filter to have needed carrier rejection at e.g., 400 kHz, with negligible signal loss at 20 kHz.

We claim:

1. An improved class BD power amplifier having a three-level output signal, comprising:
   at least two power rails;
   a first switch alternately connecting each respective power rail from a first respective potential to a second respective potential such that the instaneous potential difference between the two power rails is constant;
   an output amplifier stage having a single output terminal; and
   a second switch alternately connecting said output amplifier stage from one of said power rails to another of said power rails.

2. The amplifier according to claim 1, wherein said output amplifier stage is a class AD amplifier stage.

3. The amplifier according to claim 1, wherein said first and second switches are transistor switches.

4. The amplifier according to claim 1, further comprising a fixed power supply which provides said first respective potential.

5. The amplifier according to claim 1, wherein said second respective potential is ground.

6. The amplifier according to claim 1, wherein an instantaneous potential difference between said at least two power rails is constant.

7. The amplifier according to claim 1, further comprising a floating power supply which provides said first respective potential.

8. A method of pulse width modulation amplifying an input signal, comprising:
   alternately supplying a first supply potential and a second supply potential to a first power rail;
   alternately supplying a third supply potential and a fourth supply potential to a second power rail;
   maintaining a constant potential difference between said first power rail and said second power rail;
   alternately connecting one of said first power rail and said second power rail to an amplifier output stage.

9. The method of pulse width modulation amplifying an input signal as claimed in claim 8, wherein said alternately supplying said supply potentials to said first and said second power rails is in accordance with dual sampling input drive waves.

10. The method of pulse width modulation amplifying an input signal as claimed in claim 8, wherein said amplifier output stage is a class AD power amplifier stage.

11. An improved class BD power amplifier, comprising:
    first and second potential supply nodes and at least one ground node;
    first and second power rails;
    a first switch, said first switch connecting said first power rail alternately to said first potential supply node and to said ground node and connecting said second power rail alternately to said ground node and to said second potential supply node, in accordance with a first input drive wave, such that the instantaneous potential difference between said first power rail and said second power rail is constant;
    an output stage; and
    a second switch alternately connecting said output stage to said first power rail and to said second power rail in accordance with a second input drive wave.

12. The power amplifier according to claim 11, wherein said first input drive wave is a pulse train which results from sampling a triangular carrier wave in accordance with an input signal.

13. The power amplifier according to claim 12, wherein a duty cycle of said pulse train is greater than 50% when said input signal is positive, less than 50% when said input signal is negative and 50% when said input signal is zero.

14. The power amplifier according to claim 11, wherein said second input drive wave is a pulse train which results from sampling a triangular carrier wave in accordance with an input signal.

15. The power amplifier according to claim 11, wherein said first input drive wave and said second input drive wave are substantially identical.

16. The power amplifier according to claim 11, wherein said output stage is a class AD amplifier stage having a single output terminal.

17. The power amplifier according to claim 11, wherein said first and second switches are switching transistors.

18. A method of amplifying an input signal, comprising the steps of:
    alternately connecting a first power rail to one of a first potential and ground in accordance with a first input drive wave;
    alternately connecting a second power rail to one of ground and a second potential in accordance with said first input drive wave, such that the instantaneous potential difference between said first power rail and said second power rail is constant; and
    alternately connecting an output amplifier stage to one of a first and a second power rails in accordance the a second input drive wave.

19. The method of claim 18, wherein:
    a first switch alternately connects said amplifier stage to said respective power rails; and a second switch alternately connects said respective first and second power rails to said respective first and second potentials and ground.

20. The method of claim 19, further comprising the step of:

actuating said first and second switches in accordance with an input drive wave.

21. The method of claim 18, wherein said first input drive wave is a pulse train having a duty cycle greater than 50% when the input signal is positive, less than 50% when the input signal is negative, and 50% when the input signal is zero.

22. The method of claim 18, wherein said first and said second input drive waves are substantially identical.

23. The method of claim 21, wherein said first and said second input drive waves are substantially identical.

24. A method of amplifying an input signal comprising the steps of:

sampling a triangular carrier waveform according to the input signal to produce first and second pulse-wave-modulated input drive waves;

alternately switching an output stage to one of a first power rail and a second power rail according to said first pulse-wave-modulated input drive wave;

alternately switching said first power rail to one of a first potential and ground according to said second pulse-wave-modulated input drive wave; and alternately connecting said second power rail to one of a second potential and ground according to said second pulse-wave-modulated input drive wave, such that the instantaneous potential difference between said first power rail and said second power rail is constant.

25. The method of amplifying an input signal according to claim 24, wherein said first and said second pulse wave modulated input drive waves are substantially identical.

26. A method of amplifying an input signal, comprising the steps of:

providing a first potential on a first power rail;

providing a second potential on a second power rail;

deriving a first input drive wave from the input signal;

deriving a second input drive wave from the input signal;

alternately connecting one of said first and said second power rails to an output stage in accordance with said first input drive wave; and alternately connecting one of said first and said second power rails to ground in accordance with said second input drive wave, such that the instantaneous potential difference between said first power rail and said second power rail is constant.

27. The method of claim 26, wherein said first input drive wave is a pulse train having a duty cycle greater than 50% when the input signal is positive, less than 50% when the input signal is negative, and 50% when the input signal is zero.

* * * * *